United States Patent
Nelson et al.

(10) Patent No.: US 10,332,893 B2
(45) Date of Patent: Jun. 25, 2019

(54) ARCHITECTURE TO COMMUNICATE SIGNALS FOR OPERATING A STATIC RANDOM ACCESS MEMORY

(71) Applicant: Intel Corporation, Santa Clara, CA (US)

(72) Inventors: Donald W. Nelson, Beaverton, OR (US); Eric A. Karl, Portland, OR (US)

(73) Assignee: Intel Corporation, San Clara, CA (US)

( * ) Notice: Subject to any disclaimer, the term of this patent is extended or adjusted under 35 U.S.C. 154(b) by 0 days.

(21) Appl. No.: 15/747,414

(22) PCT Filed: Sep. 25, 2015

(86) PCT No.: PCT/US2015/052250
§ 371 (c)(1),
(2) Date: Jan. 24, 2018

(87) PCT Pub. No.: WO2017/052593
PCT Pub. Date: Mar. 30, 2017

(65) Prior Publication Data
US 2018/0219015 A1    Aug. 2, 2018

(51) Int. Cl.
*G11C 11/00* (2006.01)
*H01L 27/11* (2006.01)
(Continued)

(52) U.S. Cl.
CPC ........ *H01L 27/1104* (2013.01); *G11C 11/418* (2013.01); *G11C 11/419* (2013.01); *H01L 27/1116* (2013.01); *G11C 11/413* (2013.01)

(58) Field of Classification Search
None
See application file for complete search history.

(56) References Cited

U.S. PATENT DOCUMENTS

2005/0012125 A1*  1/2005  Summerfelt ...... H01L 27/11502
                                                  257/295
2007/0275533 A1   11/2007  Vaed et al.
(Continued)

OTHER PUBLICATIONS

International Search Report and Written Opinion for International Patent Application No. PCT/US2015/052250 dated Jul. 11, 2016, 11 pgs.
(Continued)

*Primary Examiner* — Uyen B Tran
(74) *Attorney, Agent, or Firm* — Schwabe, Williamson & Wyatt, P.C.

(57) ABSTRACT

Techniques and mechanisms for exchanging signals with one or more transistors at a front side of a semiconductor substrate. In an embodiment, an integrated circuit include a cell—such as a static random access memory (SRAM) cell—comprising transistor structures variously disposed in or on a first side of a substrate. After fabrication of such transistor structures, substrate material may be thinned to expose a second side of the substrate, opposite the first side. A first interconnect and a second interconnect are coupled each to exchange a signal or a voltage. In another embodiment, respective portions of the first interconnect and the second interconnect extend on opposite sides of the substrate, wherein the first side and the second side each extend between such interconnect portions. Positioning of interconnect structures on opposite sides of the substrate allow for performance improvements due to low interconnect resistances.

16 Claims, 9 Drawing Sheets

(51) Int. Cl.
   *G11C 11/418*   (2006.01)
   *G11C 11/419*   (2006.01)
   *G11C 11/413*   (2006.01)

(56) References Cited

U.S. PATENT DOCUMENTS

| | | |
|---|---|---|
| 2007/0296002 A1 | 12/2007 | Liang et al. |
| 2008/0054313 A1 | 3/2008 | Dyer et al. |
| 2011/0317485 A1* | 12/2011 | Liaw ..................... H01L 27/11 365/182 |
| 2013/0049215 A1* | 2/2013 | Larsen ................. H01L 23/485 257/774 |
| 2014/0003133 A1* | 1/2014 | Lin ....................... G11C 11/419 365/154 |
| 2014/0291860 A1 | 10/2014 | Stuber et al. |

OTHER PUBLICATIONS

International Preliminary Search Report for International Patent Application No. PCT/US2015/052250, dated Apr. 5, 2018, 8 pages.

* cited by examiner

ARCHITECTURE TO COMMUNICATE SIGNALS FOR OPERATING A STATIC RANDOM ACCESS MEMORY

CROSS-REFERENCE TO RELATED APPLICATION

This patent application is a U.S. National Phase Application under 35 U.S.C. § 371 of International Application No. PCT/US2015/052250, filed Sep. 25, 2015, entitled "ARCHITECTURE TO COMMUNICATE SIGNALS FOR OPERATING A STATIC RANDOM ACCESS MEMORY," which designates the United States of America, the entire disclosure of which is hereby incorporated by reference in its entirety and for all purposes.

BACKGROUND

1. Technical Field

Embodiments discussed herein relate generally to the field of integrated circuits and more particularly, but not exclusively, to control signals paths of a memory device.

2. Background Art

Conventional integrated circuit architectures and processes—such as those for static random access memory (SRAM)—provide transistors in or on a side of a semiconductor substrate, and layers of metal interconnects that are built over the side of the substrate. Such interconnects are to variously deliver power, ground and control signals for operation of the transistors.

As semiconductor processes continue to scale in size, the resistance of such interconnects becomes an increasingly significant constraint on circuit performance. Increasing integration tends to require smaller pitches between interconnects, and thus smaller widths of interconnects. Resistance, which is due in part to cross-sectional dimensions of interconnects, scales non-linearly with successively smaller fabrication processes. SRAM is one type of integrated circuitry that is susceptible to poor scaling of interconnect resistance characteristics.

Some existing technologies try to reduce the effects of high interconnect resistance by strapping lines that are in separate metal layers. However, this strapping has its own limitations, such as the resistance introduced by more and/or smaller vias. Other technologies reduce the number of bits that share a given control signal (such as a wordline signal or a bitline signal) by splitting bits across multiple control signals. However, such splitting has tradeoffs such as additional logic and timing needed to address circuitry and/or to readout from such circuitry. As the trend toward smaller and faster architectures continues, there is an increasing demand for incremental improvements in the providing of low impedance paths to integrated circuitry.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
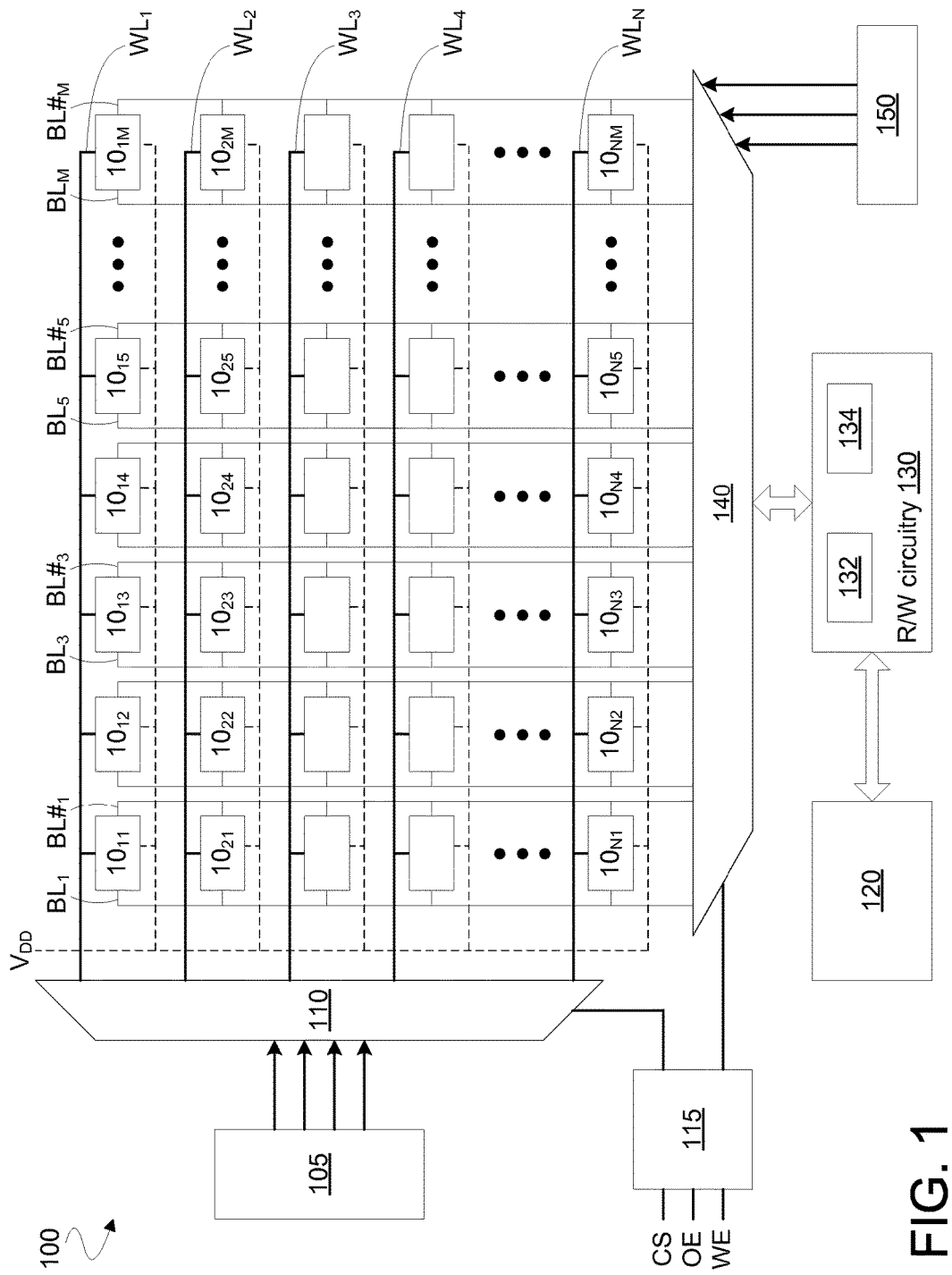
FIG. 1 is a block diagram illustrating elements of a memory system according to an embodiment.

Embodiments discussed herein variously include techniques and/or mechanisms to provide a signal and/or a voltage for operation of an integrated circuit (IC) device. In some embodiments, integrated circuitry includes a cell comprising one or more transistors, structures of which are formed in or on a first side of a semiconductor substrate. The integrated circuitry may further comprise an interconnect, a portion of which extends below and/or through a second side of the semiconductor substrate (the second side opposite the first side), where the interconnect structure is to provide a control signal for operation of the one or more transistors.

As used herein with respect to a substrate of an integrated circuit device, "front side" (unless otherwise indicated) refers to a side of the substrate on which structures of a transistor are disposed and/or in which structures of the transistor extend. Such structures may include a doped region of the substrate—e.g., where the doped region is to serve as a source of the transistor or a drain of the transistor. Alternatively or in addition, such structures may include a gate that is disposed on the front side of the substrate. Operation of the transistor may include activation of channel that is to exchange current, between a source and a drain, in a region of the substrate that adjoins the front side. As used herein with respect to a substrate, "back side" refers to a side of the substrate is opposite to the front side of that substrate—e.g., where the front side and back side extend in respective planes that are parallel to, and offset from, one another. A structure may be considered to be "above" a front side of a substrate where the structure is in direct contact with the front side or, alternatively, is coupled to the substrate via another structure on the front side. Similarly, a structure may be considered to be "below" (or "under") a back side of a substrate where the structure is in contact with back side or, alternatively, is coupled to the substrate via another structure on the back side.

Features of various embodiments are described herein with reference to the providing of a bitline signal or a wordline signal to an SRAM memory cell via an interconnect, at least a portion of which extends below a back side of a substrate. However, such discussion may be extended to additionally or alternatively apply to the exchanging of any of a variety of signals, voltages, etc. to or from circuitry via an interconnect that extends at least in part below a back side of a substrate. For example, interconnect structures according to different embodiments may exchange a control signal, data signal, supply voltage, reference potential (e.g., a ground) or the like with any of a variety of types of memory cells (e.g., other than an SRAM cell), with a cell of a register file or with other integrated circuitry comprising transistor structures disposed in or on a front side of a substrate. By way of illustration and not limitation, some embodiments may additionally or alternatively dispose at least a portion of bus traces (e.g., signal lines of a data bus, address bus and/or the like) or a clock signal line below a back side of a substrate.

FIG. 1 shows an illustrative example of a memory array 100 including interconnect structures to operate integrated circuitry according to an embodiment. Memory array 100 may include many cells typically arranged in an N×M matrix comprising N M-bit words.

As shown in FIG. 1, SRAM cells 10 of a SRAM memory array 100 may be arranged in an N×M matrix, with N cells in each column and M cells in each row. Each row corresponds to an M-bit word while the ith column corresponds to the ith bit of each word, where $1 \le i \le M$. Each cell 10 in the matrix may be coupled to a wordline and two bitlines, as shown. N wordlines $WL_1, \ldots, WL_N$ are connected to a row decoder 110. The row decoder 110 may decode a row address signal (address 105) and activate the corresponding wordline $WL_j$, where $1 \le j \le N$, for either a read or a write operation. Accordingly, the wordline $WL_j$ may activate M cells 10 along the corresponding row of the memory array 100. Thus, when the wordline $WL_2$ is activated, SRAM cells $10_{21}, 10_{22}, 10_{23}, 10_{24}, 10_{25}, \ldots, 10_{2M}$ may be simultaneously accessible for read or write operations. Within each of these SRAM cells, the wordline may activate access transistors which connect the corresponding bitlines BL and BL# to the internal storage of the cell. The cell matrix of the memory array 100 further includes 2M bitlines, $BL_i$ and $BL\#_i$, where $1 \le i \le M$; thus, there may be two complementary bitlines for each column of cells. The column decoder 140 may decode a column address signal (address 150) and activates the corresponding BL/BL# pair. The bitline pairs may be selectively connected to read/write (R/W) circuitry 130, including a sense amplifier 132 (for read operations) and a write driver 134 (for write operations).

When a read is being performed, the value stored in the cell 10 may be sent to the bitline BL while the complement of the value is sent to bitline BL#. When a write is being performed, the value to be stored may be sent to the bitline BL, while the complement value is sent to the bitline BL#. Data input/output (I/O) buffers 120 are connected to the R/W circuitry 130. During a read operation, the column decoder 140 may receive the data from the relevant bitline pair and send the data to the sense amplifier 132, which amplifies the signal and sends it to the data I/O (output) buffers 120, for receipt by external circuitry (not shown). During a write operation, the write driver 134 may retrieve data from the data I/O (input) buffers 120 and send the data to the relevant bitline pair corresponding to the column address signal, as selected by the column address decoder 140.

The memory array 100 further depicts an input data control 115, which receives a chip select (CS) signal, an output enable (OE) signal, and a write enable (WE) signal. Because the memory array 100 may actually include a number of distinct SRAM chips, the chip select signal may select the particular SRAM chip to be read from or written to. The output enable signal enables the data I/O buffers 120, allowing data to be transferred to/from the SRAM cell 10. The write enable signal selects whether a read operation or a write operation is taking place. These three signals may be sent to the row decoder 110 and the column decoder 140 during every read and write operation.

Figure 2:
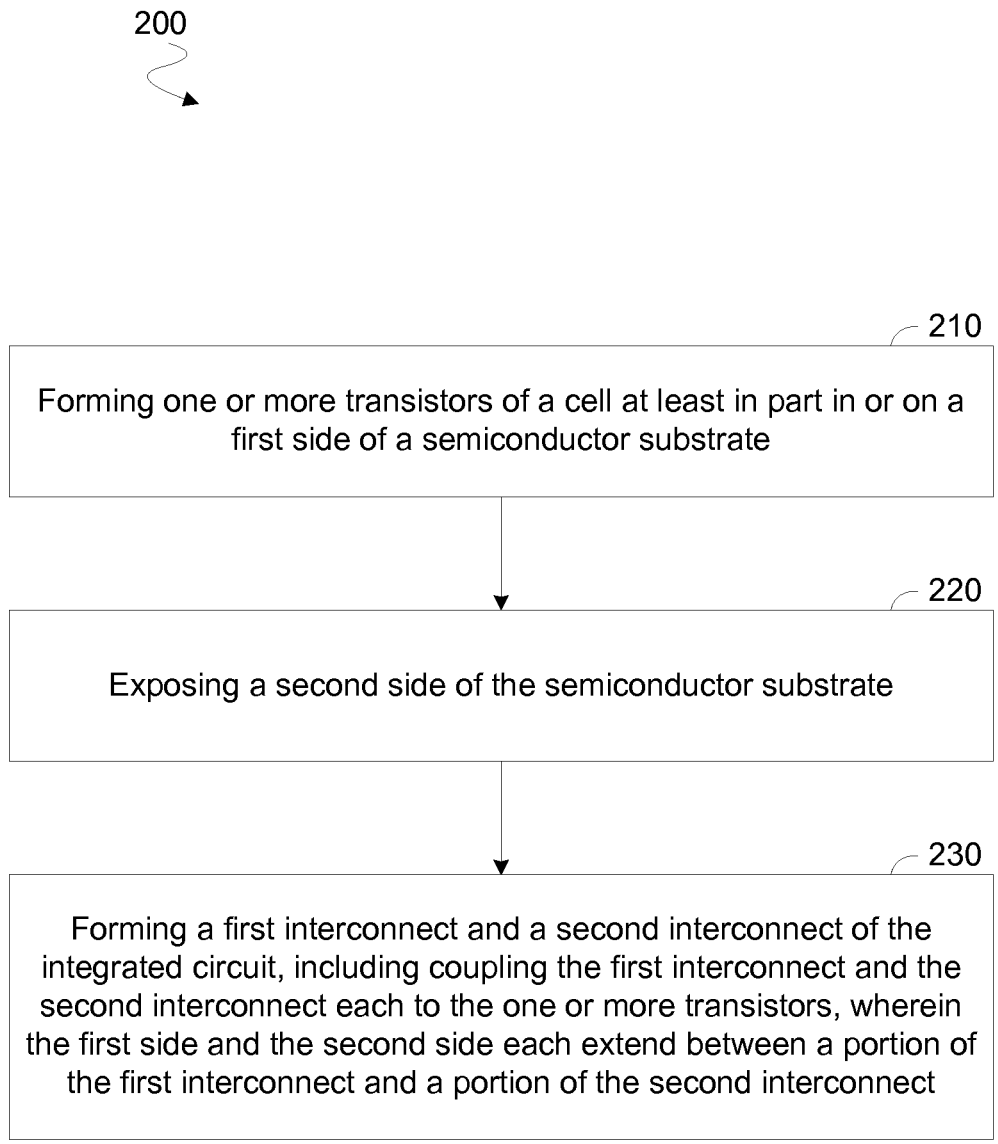
FIG. 2 is a flow diagram illustrating elements of a method for fabricating integrated circuitry of a memory device according to an embodiment.

FIG. 2 illustrates elements of a method 200 to fabricate integrated circuit structures according to an embodiment. Method 200 may fabricate any of a variety of interconnects extending, at least in part, under a back side of a substrate, as variously described herein. In an embodiment, method 200 forms a conductive path to exchange a signal or a voltage for operation of any of a variety of a register files, SRAM (or other) memory cells—e.g., of memory array 100—or other such circuitry.

Method 200 may include, at 210, forming one or more transistors of a cell at least in part in or on a first side of a semiconductor substrate. The cell may be configured to selectively store a bit of data—e.g., where the cell includes a memory cell, a cell of a register file or the like. The forming at 210 may include performing doping through the first side to form in the substrate one or more transistor source regions and/or transistor drain regions. Alternatively or in addition, the forming at 210 may include depositing on the first side a metal, polysilicon or other material of one or more transistor gates.

After the forming of the one or more transistors at 210, method 200 may, at 220, perform thinning to expose a second side of the semiconductor substrate, the second side opposite the first side. For example, method 200 may form the semiconductor substrate from a wafer that includes the first side. After the one or more transistors are formed in the wafer at 210, a handling wafer may be coupled to the wafer via the first side. The handling wafer may provide mechanical support during thinning of the wafer material to form the semiconductor substrate. The thinning may include chemical mechanical polishing or other such processing to remove substrate material.

Method 200 may further comprise, at 230, forming a first interconnect and a second interconnect of the integrated circuit. The forming at 230 may include formation of the first interconnect and the second interconnect at different respective times during method 200. For example, formation of one such interconnect may include plating or other metal deposition that is performed on the first side after formation of the one or more transistors at 210, but before the second side is exposed at 220. In such an embodiment, the other such interconnect may be subsequently formed with other processing on the second side after exposure thereof at 220. In other embodiments, some interconnect formation at 230 includes processing that is performed in or on the first side after removal of a handling wafer from the first side.

The forming at 230 may comprise coupling the first interconnect and the second interconnect each to the one or more transistors. The first interconnect and/or the second interconnect may each be coupled to exchange with some or all of the one or more transistors a respective one of a control signal, a data signal, a supply voltage, a reference potential and/or the like. For example, the first interconnect or the second interconnect may be coupled to exchange a wordline signal or a bitline signal (e.g., including one of a complementary signal pair). In an embodiment, the first side and the second side each extend between a portion of the first interconnect and a portion of the second interconnect. As a result, respective portions of the first interconnect and second interconnect may be located on opposite sides of the substrate—e.g., at least in a region including (and extending above and below) an area in which some or all transistors of the cell are disposed.

Although certain embodiments are not limited in this regard, method 200 may comprise other operations (not shown) to form additional interconnect structures that facilitate operation of the cell. For example, method 200 may further comprising forming a third interconnect of the integrated circuit—e.g., where at least part of the third interconnect extends under the second side of the substrate—and coupling the third interconnect to provide to the one or more transistors a supply voltage or a reference potential (such as a ground). In some embodiments, the forming at 230 comprises forming a first metal stack that is coupled, for example, via the second side to the semiconductor substrate. In such an embodiment, the forming at 230 may further comprise forming a second metal stack that is coupled to the semiconductor substrate via the first side e.g., where the first metal stack includes the first interconnect and the second metal stack includes the second interconnect. Any of a variety of other interconnect structures described herein may be additionally or alternatively fabricated by method 200, according to different embodiments.

Figure 3:
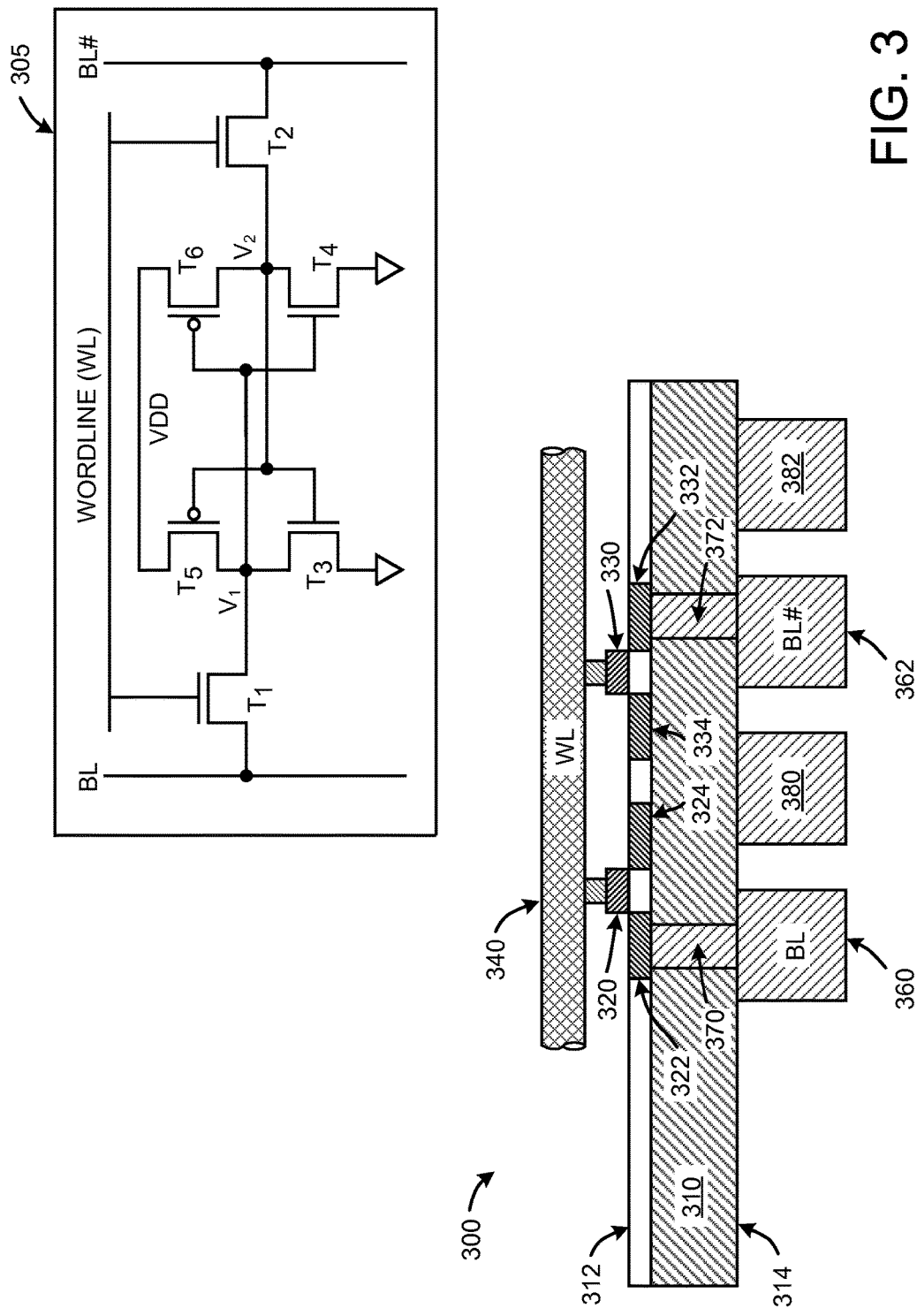
FIG. 3 is a layout diagram illustrating elements of integrated circuitry according to an embodiment.

FIG. 3 shows a circuit diagram of a six-transistor (6T) SRAM memory cell 305 such as one that may be part of memory array 100, for example. In an embodiment, memory cell 305 includes structures, such as those shown in cross-sectional view 300, to communicate a signal to one or more transistors via an interconnect portion that extends under a back side of a substrate. Memory cell 305 is merely one example of a cell that is coupled to exchange a signal with such interconnect structures. However, any of a variety of other types of memory cells, register file cells and/or other such integrated circuitry may be coupled to operate with such interconnect structures, according to different embodiments. In an embodiment, fabrication of the circuitry in cross-sectional view 300 includes processing according to method 200.

The illustrative cell 305 includes six transistors, $T_1, \ldots, T_6$—e.g., metal oxide semiconductor field effect (MOSFET) transistors—each including three terminals: a source terminal, a drain terminal, and a gate terminal. In an embodiment, transistors $T_1$, $T_2$, $T_3$, and $T_4$ are N-type MOSFETs, or NMOS transistors, while transistors $T_5$ and $T_6$ are P-type MOSFETs, or PMOS transistors.

A supply voltage $V_{DD}$ may be connected to the source terminals of transistors $T_5$ and $T_6$. Transistors $T_5$ and $T_6$ control the flow of current to transistors $T_3$ and $T_4$ of the SRAM cell 305. Transistors $T_5$ and $T_6$ are referred to herein as pull-up transistors, or $T_U$, of the SRAM cell 305. The PMOS transistors $T_U$ may additionally include a fourth terminal, bulk (not shown), which may be tied to the source terminal of its respective transistor.

The source terminals of transistors $T_3$ and $T_4$ may be connected to ground. Transistors $T_3$ and $T_4$ are referred to herein as pull-down transistors, or $T_D$, of the SRAM cell 305. The drain terminals of transistors $T_5$ and $T_6$, the pull-up transistors, may be coupled to the drain terminals of transistors $T_3$ and $T_4$, the pull-down transistors. The transistors $T_3$, $T_4$, $T_5$, and $T_6$ are logically identical to two back-to-back inverters.

A horizontal wordline, WL, may be connected to the gate terminals of transistors $T_1$ and $T_2$. Within SRAM cell 305, the wordline WL may activate the access transistors $T_1$ and $T_2$, which connects the corresponding bitlines BL and BL# to the internal storage of the cell. The source (or drain) terminal of transistor $T_1$ may be connected to bitline BL while the source (or drain) terminal of transistor $T_2$ may be connected to bitline BL#. Bitlines BL and BL# may be complementary bitlines at least insofar as one bitline transmits a "1" or "0" value while the other bitline transmits its complement, "0" or "1". Transistors $T_1$ and $T_2$ may be turned on by the activation of wordline WL, allowing access between the bitlines BL/BL# and the rest of the cell 305. Transistors $T_1$ and $T_2$ may thus be referred to as the access transistors, or $T_A$, of the SRAM cell 10.

The access transistors $T_1$ and $T_2$, when enabled, couple the bitlines BL and BL# to the complementary cell values, designated as $V_1$ and $V_2$. The SRAM cell value $V_1$ may be stored on one side of the cell (drain terminals of $T_3$ and $T_5$) and the complement of the cell value $V_2$ may be stored on the other side of the cell (drain terminals of $T_4$ and $T_6$). Transistors $T_3$ and $T_4$ may be feedback-coupled transistors, in which the drain terminal of transistor $T_3$ is coupled to the gate terminal of transistor $T_4$ while the drain terminal of transistor $T_4$ is coupled to the gate terminal of transistor $T_3$. Example embodiments described herein refer to a 6T SRAM cell; nevertheless, the principles apply to other types of SRAM cells, such as a 4T SRAM cell, various non-SRAM memory cells, a register file cell or other such integrated circuitry.

As shown in cross-sectional view 300, memory cell 305 may be coupled to exchange one or more signals and/or voltages—e.g., including WL, BL and/or BL#—each via a respective interconnect portion that extends beneath a backside of a substrate in which and/or on which transistors, $T_1, \ldots, T_6$ are variously disposed. A semiconductor substrate 310 forms a front side 312 and a back side 314 opposite the front side 312, where transistor structures are variously formed in or on front side 312. For example, transistor $T_1$ of memory cell 305 may comprise a gate 320 disposed on side 312, and doped regions 322, 324 (e.g., source and drain, respectively) that are each disposed under, and adjoin, side 312. Alternatively or in addition, transistor $T_2$ of memory cell 305 may comprise a gate 330 disposed on side 312, and doped regions 332, 334 (e.g., source and drain, respectively) that are each disposed under, and adjoin, side 312. Lighter shading is used herein to variously indicate a transistor layer including a front side of a substrate.

In an embodiment, one or more transistors are coupled to exchange a signal via an interconnect, a portion of which extends disposed on or below surface 314. By way of illustration and not limitation, an interconnect to communicate a bitline signal BL to doped region 322 may include an trace portion 360 (shown in cross-section) and a via 370, where trace portion 360 extends along or under the surface of side 314, and via 362 extends between trace portion 360 and doped region 322 through side 314 and at least partially through substrate 310. Alternatively or in addition, an interconnect to communicate a complementary bitline signal BL# to doped region 322 may include an trace portion 362 (shown in cross-section) and a via 372, where trace portion 362 extends along or under the surface of side 314, and via 372 extends between trace portion 362 and doped region 332 through substrate 310. Although certain embodiments are not limited in this regard, a transistor or transistors may further exchange one or more signals, voltages, etc. each via respective interconnects that are disposed on or above side 312. For example, an interconnect 340 to provide a wordline signal WL to gate 320 and/or to gate 330 may include a trace disposed in a metal layer that is above side 312.

Although some embodiments are not limited in this regard, one or more interconnects extending below back side 314 may additionally or alternatively communicate a reference potential (e.g., ground), a supply voltage (e.g., Vcc, Vdd, etc.) or any of a variety of other signals, whether input, output, data, control and/or the like. The illustrative power lines 380, 382 are examples of such additional or alternative interconnect structures. In providing for interconnect structures on either side of substrate 310, various embodiments allow interconnects to be thicker and/or to have larger pitch. This may enable interconnects of IC devices to have relatively low resistance and/or wider span, thus allowing for improved signaling characteristics.

Figure 4A:
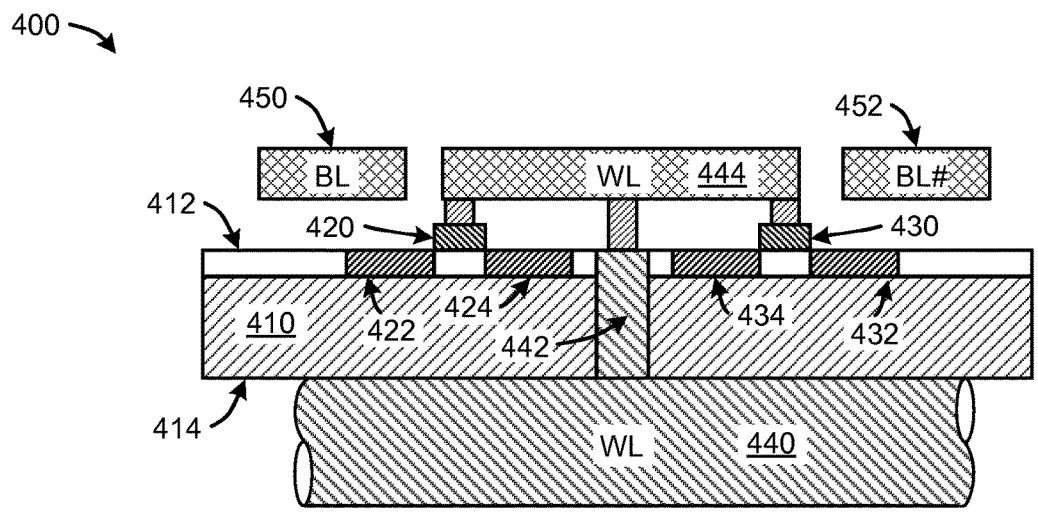
FIGS. 4A, 4B are layout diagrams each illustrating elements of respective integrated circuitry according to a corresponding embodiment.

FIG. 4A shows a cross-sectional view 400 of circuitry coupled to exchange a signal via a backside of a semiconductor substrate according to another embodiment. Integrated circuitry shown in cross-sectional view 400 may include some or all of the features of memory cell 305, for example. In an embodiment, fabrication of the circuitry in cross-sectional view 400 includes processing according to method 200. As shown in cross-sectional view 400, one or more transistors disposed in or on a substrate may be coupled to exchange a signal, voltage or the like via an interconnect, at least a portion of which extends beneath a backside of the substrate.

For example, a semiconductor substrate 410 may form a front side 412 and a back side 414, where transistor structures are formed in or on front side 412. In the illustrative embodiment shown, a first transistor comprises a gate 420 disposed on side 412, and doped regions 422, 424 that each extend under, and adjoin, side 412. Alternatively or in addition, a second transistor may comprise a gate 430 disposed on side 412, and doped regions 432, 434 that each extend under, and adjoin, side 412. Operation of the first transistor may include gate 420 activating a channel between doped regions 422, 424 in response to a signal such as the illustrative wordline signal WL. Similarly, operation of the second transistor may include gate 430 activating a channel between doped regions 432, 434 in response to the same signal (or, alternatively, some other signal). However, the particular type, number and relative configuration of such transistors in cross-sectional view 400 is merely illustrative, and may vary according to different embodiments.

In an embodiment, an interconnect to communicate a wordline signal WL to one or both of gates 420, 430 may include a trace portion 440 (shown in side view), a via 442 and another trace portion 444. Trace portion 440 may extend along or under the surface of side 414, where trace portion 444 extends above side 412 and via 462 extends through substrate 410 to provide coupling of trace portions 440, 444 to one another. The interconnect may further comprise other via structures variously disposed over side 412 for coupling via 442 to trace portion 444 and/or for coupling trace portion 444 to one or both of gates 420, 430. Although certain embodiments are not limited in this regard, one or more other interconnect structures to operate a transistor may extend above side 412. Such interconnect structures—e.g., including the illustrative interconnect portions 450, 452 (shown in cross-section)—may be variously coupled by via structures (not shown) for operation of the first transistor and/or the second transistor. For example, interconnect portion 450 may be coupled to provide a bitline signal BL to doped region 422 and/or interconnect portion 452 may be coupled to provide a complementary bitline signal BL# to doped region 432.

Figure 4B:
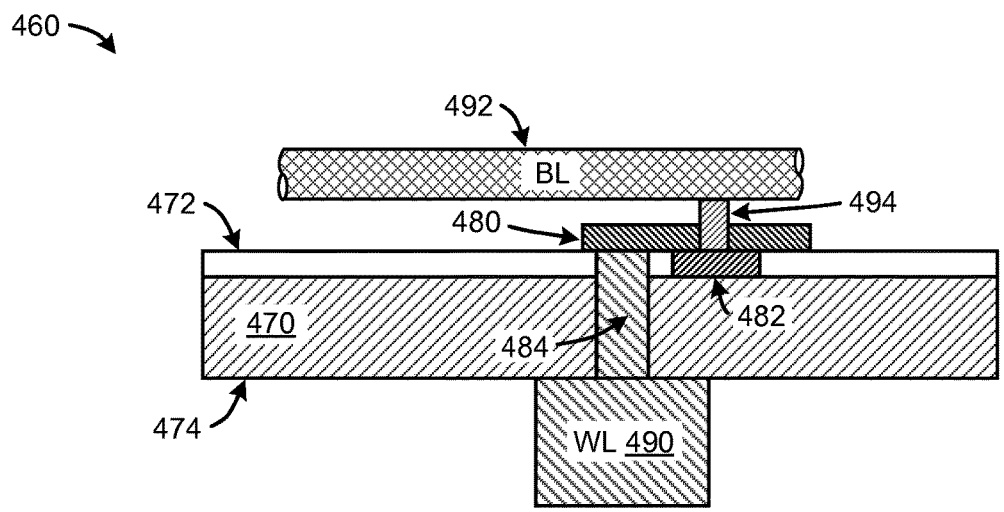

FIG. 4B shows a cross-sectional view 460 of circuitry coupled to exchange a signal via a backside of a semiconductor substrate according to another embodiment. Integrated circuitry shown in cross-sectional view 460 may include some or all of the features of memory cell 305, for example. In an embodiment, fabrication of the circuitry in cross-sectional view 460 includes processing according to method 200. As shown in cross-sectional view 460, one or more transistors disposed in or on a substrate may be coupled to exchange a signal, voltage or the like via an interconnect, at least a portion of which extends beneath a backside of the substrate.

For example, a semiconductor substrate 470 may form a front side 472 and a back side 474, where transistor structures are formed in or on front side 472. In the illustrative embodiment shown, a transistor comprises a gate 480 disposed on side 472, and a doped region 482 that extends under and adjoins side 472. Responsive to a signal, such as the illustrative wordline signal WL, gate 480 may activate a channel between doped region 482 and another doped region (not shown) of the transistor. In an embodiment, an interconnect to communicate wordline signal WL to gate 480 includes a trace portion 490 (shown in cross-section) that extends along or under the surface of side 474. Such an interconnect may further comprise a via 484 that extends from trace portion 490 through back side 474 and at least partially through substrate 470—e.g., where via 484 couples directly to gate 480 at side 472. One or more other interconnect structures to operate a transistor may extend above side 472, in some embodiments. For example, an interconnect portion 492 (shown in side view) may be coupled by a via 494 to provide a bitline signal BL to doped region 482.

Figure 5A:
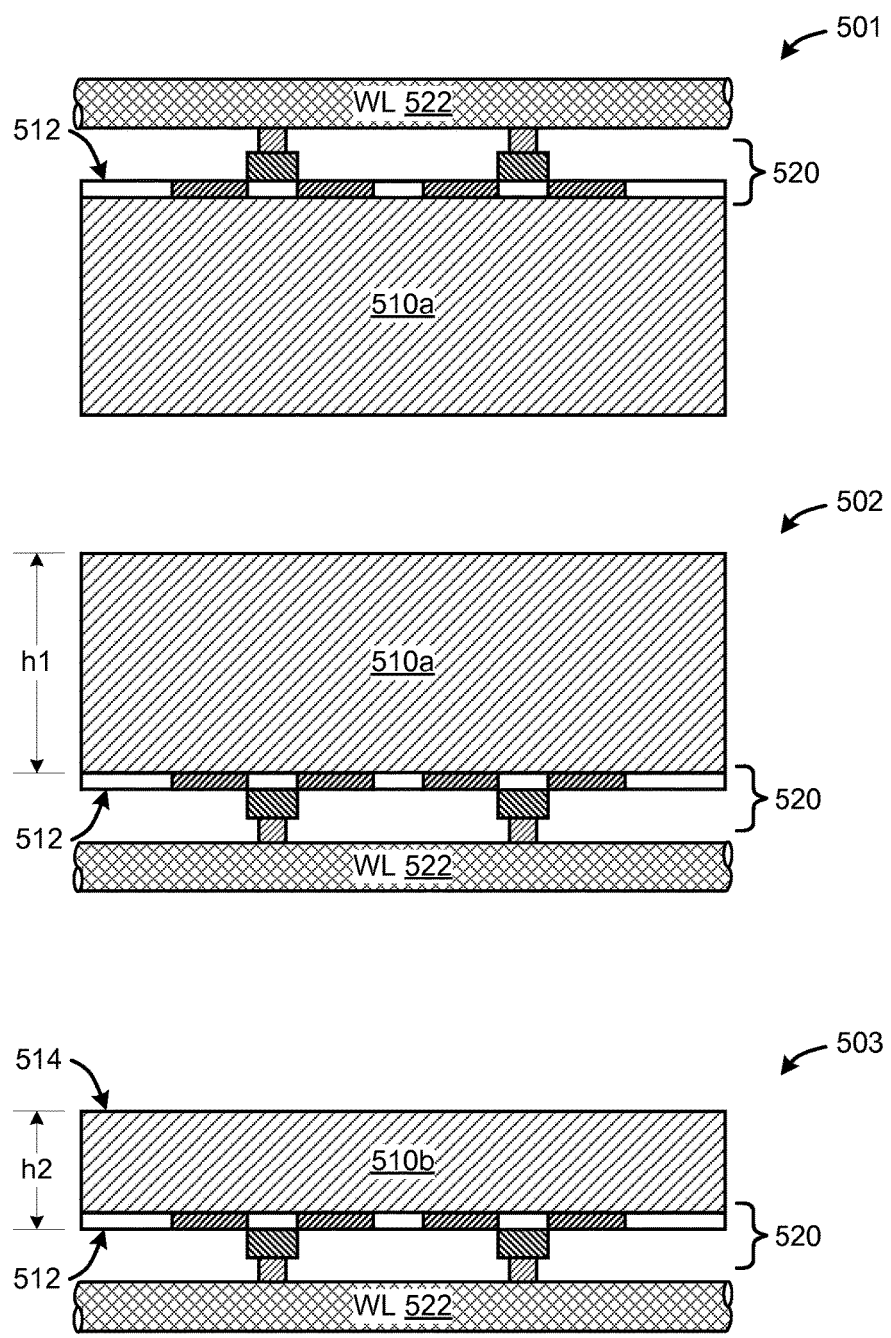
FIGS. 5A, 5B show cross-sectional views illustrating processing to fabricate interconnect structures of an integrated circuit according to an embodiment.
Figure 5B:
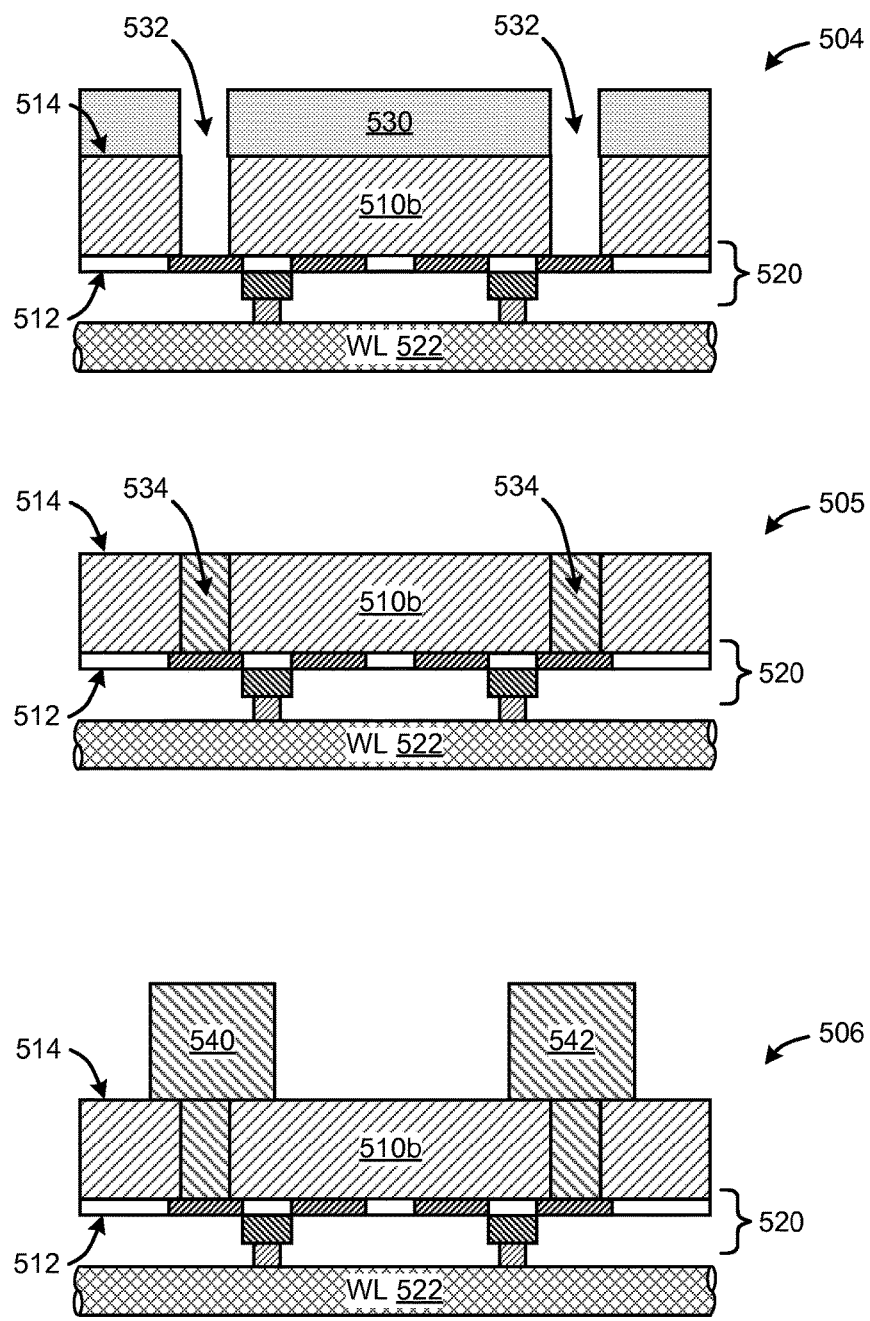

FIGS. 5A, 5B show in cross-sectional views various stages 501-506 of processing to fabricate integrated circuit structures according to an embodiment. Processing such as that of stages 501-506 may include operations of method 200, for example. In an embodiment, such processing may fabricate integrated circuitry structure such as that shown in one of cross-sectional views 300, 400, 460.

At stage 501, a bulk substrate material 510a includes a side 512, where processing variously forms in and/or on side 512 transistor structures 520, such as those of one or more SRAM memory cells. Substrate material 510a may include any of a variety of materials adapted from conventional wafer processing techniques—e.g., including, but not limited to, silicon on insulator (SOI) material, a lightly doped monocrystalline silicon or germanium and/or the like. For example, bulk substrate material 510a may be that of a wafer, where the processing represented by stages 501-506 forms a substrate 510b from that wafer. Transistor structures 520 may include, for example, a respective gate and/or doped regions for each of one or more transistors. Formation of transistor structures 520 in and on side 512 may include any of a variety of masking, doping, etching, metal deposition and/or other operations adapted from conventional IC fabrication techniques. Certain embodiments are not limited with respect to the particular type, number, relative arrangement and/or method of fabricating one or more transistors of transistor structures 520.

Although some embodiments are not limited in this regard, one or more interconnects to provide for operation of transistor structures 520 may be formed on or above side 512. By way of illustration and not limitation, an interconnect to provide a wordline signal may include a trace portion WL 522 (shown in side view) that, for example, is coupled to one or more gates disposed on side 512. Trace portion WL 522 may be formed in a metal layer—e.g., of a metal stack (not shown) including multiple metal layers—that is formed on side 512. Fabrication of such a metal stack may include operations adapted from any of a variety of conventional masking, etching, metal deposition and/or other techniques, which are not detailed herein and are not limiting on some embodiments.

At stage 502, the assembly formed at stage 501 may be inverted or otherwise prepared for thinning that is to remove some of the bulk substrate material 510a. For example, a handling wafer (not shown) may be coupled to substrate material 510a via front side 512 (e.g., indirectly via structures formed on front side 512), where the handling layer is to provide mechanical support during thinning of substrate material 510a. Such thinning—which, for example, may include grinding, wet etching, chemical mechanical polishing (CMP) and/or other such processes—may result in the formation of a substrate 510b from bulk substrate material 510a (e.g., where substrate 510b includes semiconductor material that was previously that of substrate material 510a). In one illustrative embodiment, bulk substrate material 510a, which has a thickness h1 that, for example, may be on the order of several hundred micrometers (um)—e.g., in a range of 200-500 um (or less, in some embodiments). The thickness h1 may be reduced to a thickness h2 that, for example, is on the order of 1-10 um. However, such dimensions may vary according to implementation-specific details, and are not limiting on certain embodiments. As shown at stage 503, such thinning may expose a back side 514 of substrate 510b that is opposite front side 512.

At stage 504, mask and etch processing may be performed, including disposing a patterned mask 530 on back side 514 and etching through the patterned mask to form one or more vias 532 each extending from back side 514 at least to a level of substrate 510b that includes some of transistor structures 520. In the illustrative embodiment shown, the one or more vias 532 variously extend each to a respective doped region (e.g., one of a transistor source and a transistor drain). After formation of the one or more vias 532, fill metal 534 may be plated and/or otherwise deposited therein to form conductive interconnect structures that extend at least partially through substrate 510b between back side 514 and one or more of transistor structures 520.

At stage 506, patterned metal deposition processing may be performed to form under substrate 510b one or more trace potions that are disposed directly or indirectly on back side 514. In the illustrative embodiment shown, trace portions 540, 542 (shown in cross-section) are coupled each to a respective via 534. Although certain embodiments are not limited in this regard, trace portions 540, 542 may be formed in the same metal layer—or in different metal layers—of a metal stack (not shown) that is formed under back side 514. Trace portions 540, 542 may be coupled, for example, each to variously provide to transistor structures 520 a respective one of complementary bitline signals. The particular configuration of trace portions 540, 543 and WL 522 is merely one example of an embodiment wherein an IC device includes interconnects coupled to one or more transistors via different respective sides of a semiconductor substrate. Any of a variety of other combinations of interconnects (e.g., each to exchange a respective one of a supply voltage, a reference potential, a control signal, a data signal or the like) may be additionally or alternatively coupled to one or more transistors via different sides of a substrate, according to different embodiments.

Figure 6:
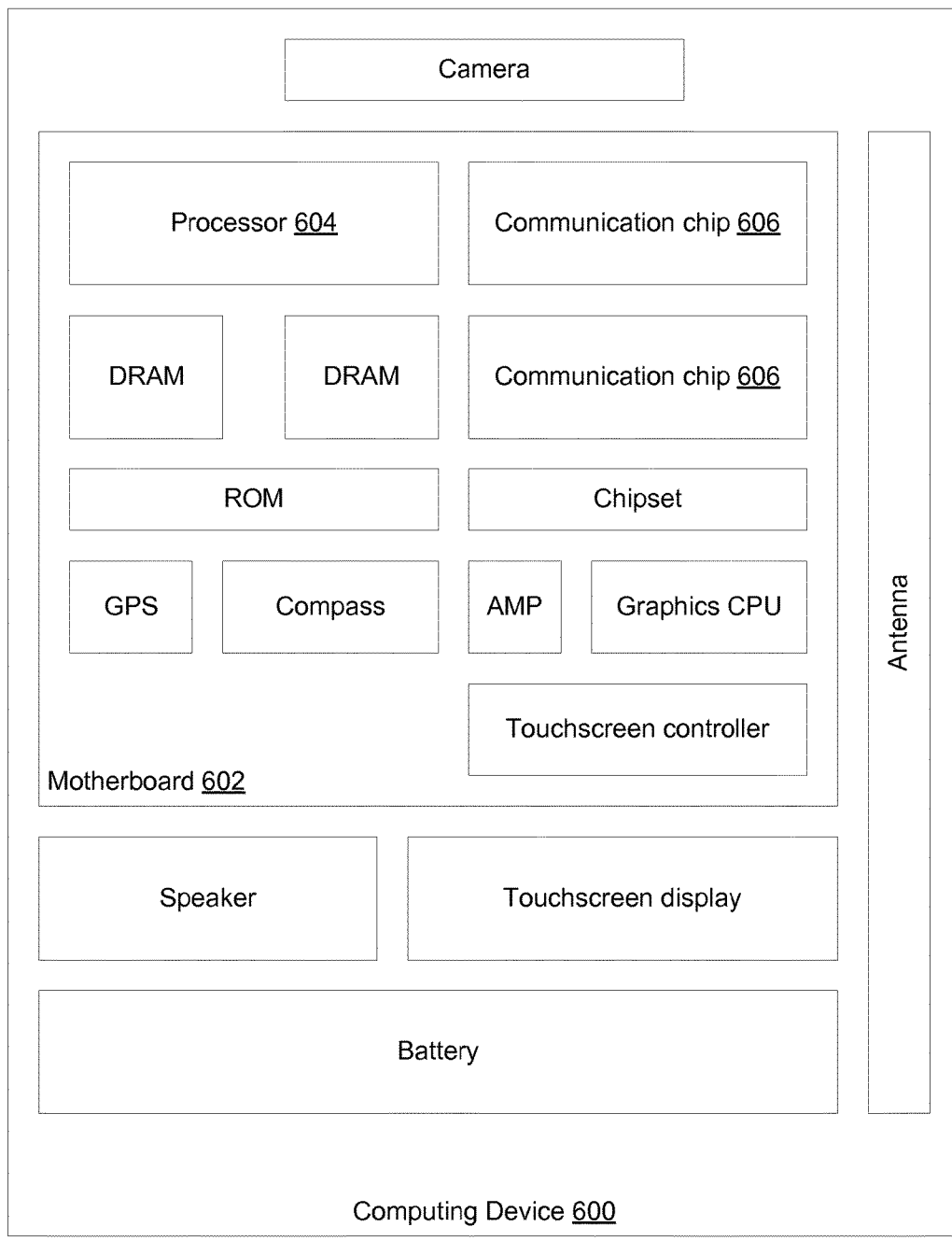
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments of the present invention may be provided as a computer program product, or software, that may include a machine-readable medium having stored thereon instructions, which may be used to program a computer system (or other electronic devices) to perform a process according to embodiments of the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
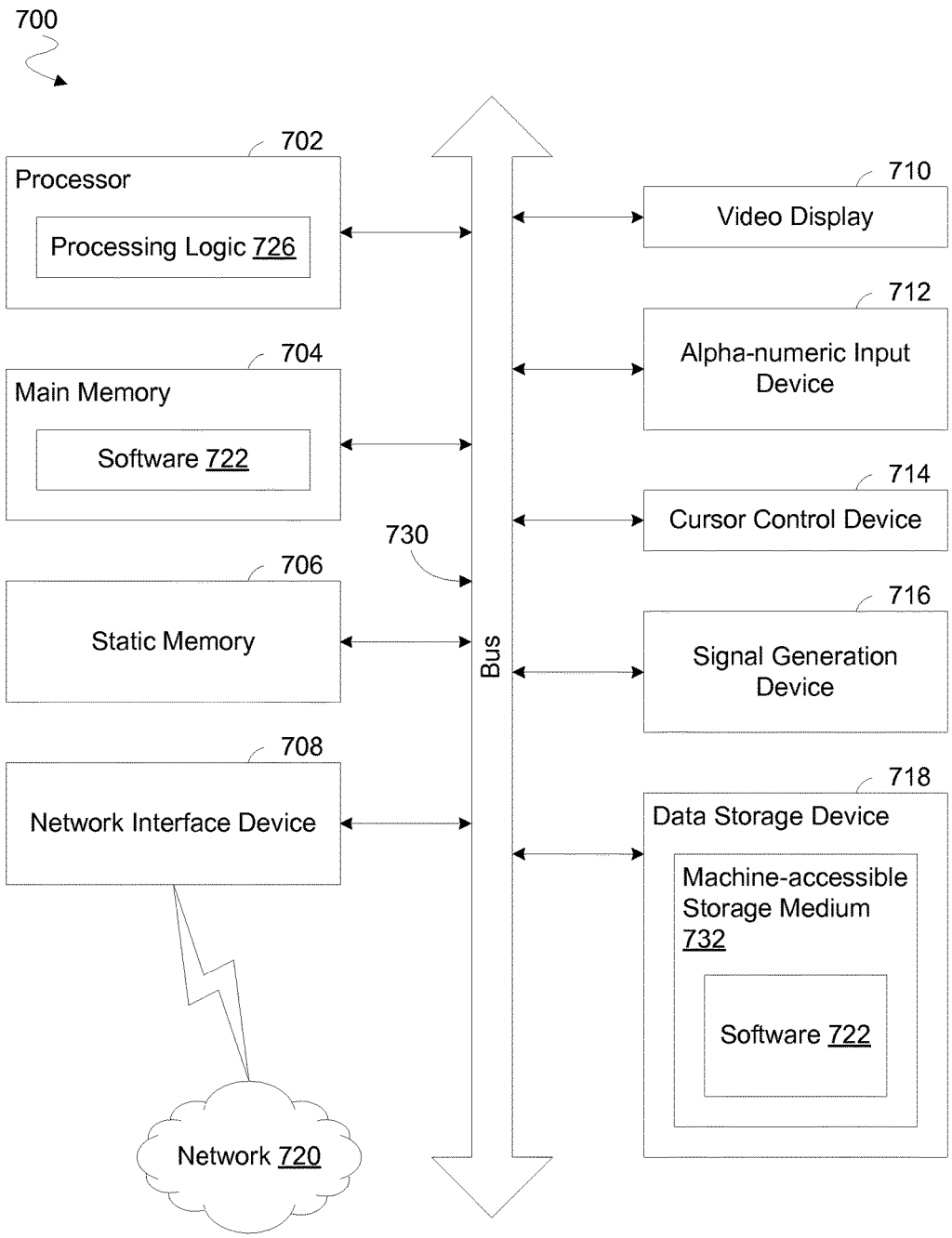
FIG. 7 illustrates a block diagram of an exemplary computer system, in accordance with an embodiment of the present invention.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Figure 8:
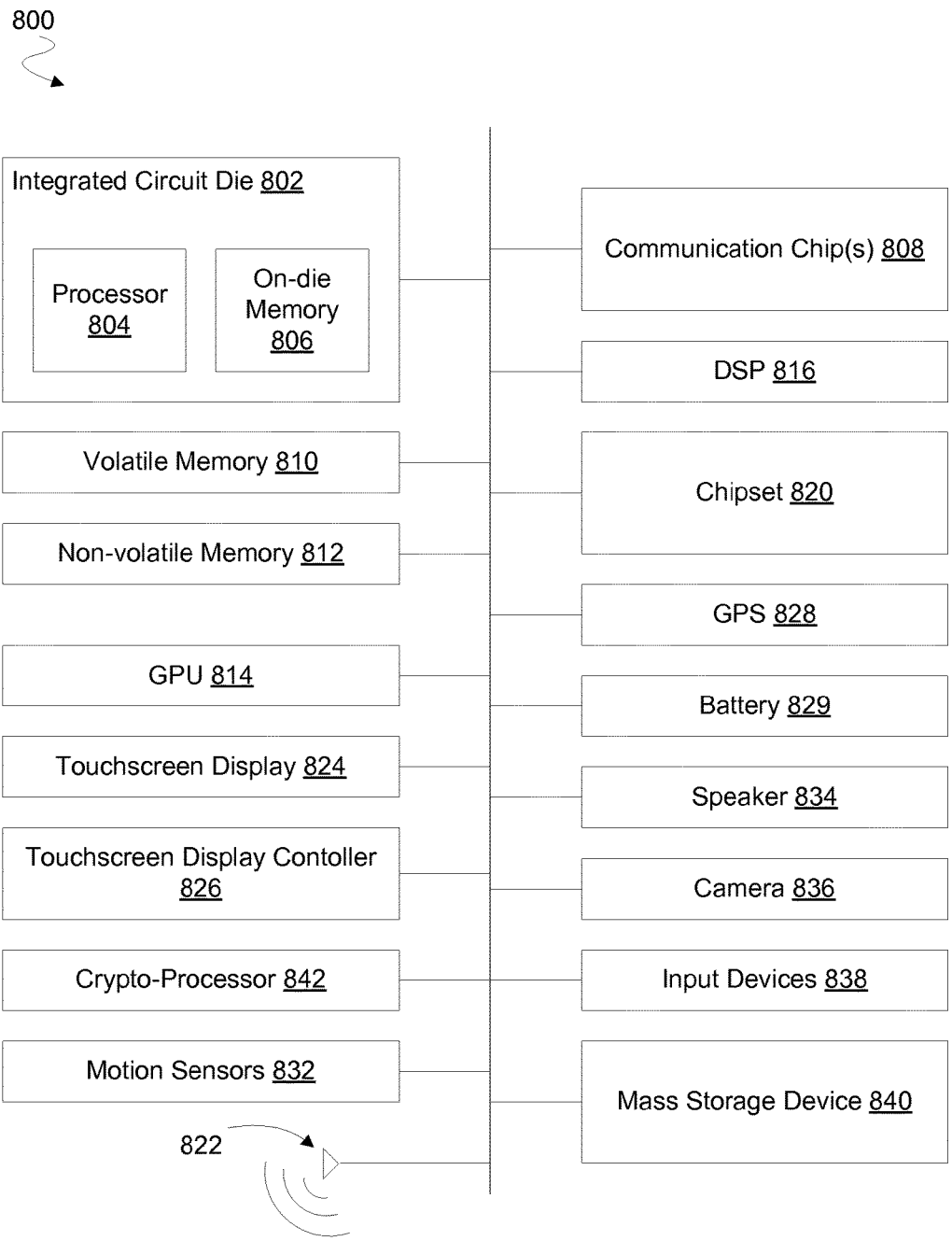
FIG. 8 is a computing device built in accordance with an embodiment of the invention.

FIG. 8 illustrates a computing device 800 in accordance with one embodiment of the invention. The computing device 800 may include a number of components. In one embodiment, these components are attached to one or more motherboards. In an alternate embodiment, these components are fabricated onto a single system-on-a-chip (SoC) die rather than a motherboard. The components in the computing device 800 include, but are not limited to, an integrated circuit die 802 and at least one communication chip 808. In some implementations the communication chip 808 is fabricated as part of the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STTM-RAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 829 or other power source, a power amplifier (not shown), a global positioning system (GPS) device 828, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications chip 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 808. For instance, a first communication chip 808 may be dedicated to shorter range wireless communications such as Wi-Fi and Bluetooth and a second communication chip 808 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

In one implementation, an integrated circuit comprises a semiconductor substrate and a cell including one or more transistors disposed at least in part in or on a first side of the semiconductor substrate, wherein a second side of the semiconductor substrate is opposite the first side. The integrated circuit further comprises a first interconnect coupled to the one or more transistors, and a second interconnect coupled to the one or more transistors, wherein the first side and the second side each extend between a portion of the first interconnect and a portion of the second interconnect.

In an embodiment, one of the first interconnect and the second interconnect is coupled to provide a control signal to the one or more transistors. In another embodiment, the control signal includes one of a wordline signal and a bitline signal. In another embodiment, the cell includes a memory cell. In another embodiment, the memory cell includes a static random access memory cell. In another embodiment, the cell includes a register file cell. In another embodiment, the first interconnect and the second interconnect are coupled each to provide a respective one of a wordline signal and a bitline signal, and the integrated circuit further comprises a third interconnect to provide to the one or more transistors one of a supply voltage and a reference potential.

In another embodiment, the first interconnect includes a via extending through the second side and the semiconductor substrate to couple directly to a gate at the first side. In another embodiment, the integrated circuit includes a first metal stack coupled to the semiconductor substrate via the second side, the first metal stack including the first interconnect. In another embodiment, the integrated circuit includes a second metal stack coupled to the semiconductor substrate via the first side, the second metal stack including the second interconnect.

In an implementation, a method for fabricating an integrated circuit comprises forming one or more transistors of a cell at least in part in or on a first side of a semiconductor substrate, and after forming the one or more transistors, performing thinning to expose a second side of the semiconductor substrate, the second side opposite the first side. The method further comprises forming a first interconnect and a second interconnect of the integrated circuit, including coupling the first interconnect and the second interconnect each to the one or more transistors, wherein the first side and the second side each extend between a portion of the first interconnect and a portion of the second interconnect.

In an embodiment, coupling the first interconnect and the second interconnect each to the one or more transistors includes coupling one of the first interconnect and the second interconnect to provide a control signal. In another embodiment, the control signal includes one of a wordline signal and a bitline signal. In another embodiment, the cell includes a memory cell. In another embodiment, the memory cell includes a static random access memory cell. In another embodiment, the cell includes a register file cell. In another embodiment, coupling the first interconnect and the second interconnect each to the one or more transistors includes coupling the first interconnect and the second interconnect each to provide a respective one of a wordline signal and a bitline signal, and the method further comprises forming a third interconnect of the integrated circuit, including coupling the third interconnect to provide to the one or more transistors one of a supply voltage and a reference potential. In another embodiment, forming the first interconnect includes forming a via extending through the second side and the semiconductor substrate, wherein the via is coupled directly to a gate at the first side. In another embodiment, forming the first interconnect includes forming a first metal stack coupled to the semiconductor substrate via the second side. In another embodiment, forming the second interconnect includes forming a second metal stack coupled to the semiconductor substrate via the first side.

In another implementation, a system comprises an integrated circuit including a semiconductor substrate, a cell including one or more transistors disposed at least in part in or on a first side of the semiconductor substrate, wherein a second side of the semiconductor substrate is opposite the first side, a first interconnect coupled to the one or more transistors, and a second interconnect coupled to the one or more transistors, wherein the first side and the second side each extend between a portion of the first interconnect and a portion of the second interconnect. The system further comprise a display device coupled to the integrated circuit, the display device to display an image based on exchanges each between the cell and a respective one of the first interconnect and the second interconnect.

In an embodiment, one of the first interconnect and the second interconnect is coupled to provide a control signal to the one or more transistors. In another embodiment, the control signal includes one of a wordline signal and a bitline signal. In another embodiment, the cell includes a memory cell. In another embodiment, the memory cell includes a static random access memory cell. In another embodiment, the cell includes a register file cell. In another embodiment, the first interconnect and the second interconnect are coupled each to provide a respective one of a wordline signal and a bitline signal, and the integrated circuit further comprises a third interconnect to provide to the one or more transistors one of a supply voltage and a reference potential. In another embodiment, the first interconnect including a via extending through the second side and the semiconductor substrate to couple directly to a gate at the first side. In another embodiment, the integrated circuit includes a first metal stack coupled to the semiconductor substrate via the second side, the first metal stack including the first interconnect. In another embodiment, the integrated circuit includes a second metal stack coupled to the semiconductor substrate via the first side, the second metal stack including the second interconnect.

Techniques and architectures for operating a memory device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit comprising:
   a semiconductor substrate;
   a cell including one or more transistors disposed at least in part in or on a first side of the semiconductor substrate, wherein a second side of the semiconductor substrate is opposite the first side;
   a first interconnect coupled to a first of the one or more transistors, the first interconnect comprising a first conductive via extending through the semiconductor substrate, and the first interconnect comprising a first trace portion beneath the second side of the semiconductor substrate; and
   a second interconnect coupled to a second of the one or more transistors, the second interconnect comprising a second conductive via extending through the semiconductor substrate, and the second interconnect comprising a second trace portion beneath the second side of the semiconductor substrate.

2. The integrated circuit of claim 1, wherein one of the first interconnect and the second interconnect is coupled to provide a control signal to the one or more transistors.

3. The integrated circuit of claim 2, wherein the control signal includes one of a wordline signal and a bitline signal.

4. The integrated circuit of claim 1, wherein the cell includes a memory cell.

5. The integrated circuit of claim 1, wherein the memory cell includes a static random access memory cell.

6. The integrated circuit of claim 1, wherein the cell includes a register file cell.

7. The integrated circuit of claim 1, the integrated circuit further comprising a third interconnect coupled to a wordline above the first side of the semiconductor substrate.

8. The integrated circuit of claim 1, a third interconnect coupled directly to a gate at the first side.

9. The integrated circuit of claim 1, wherein the integrated circuit includes a first metal stack coupled to the semiconductor substrate via the second side.

10. The integrated circuit of claim 9, wherein the integrated circuit includes a second metal stack coupled to the semiconductor substrate via the first side.

11. A system comprising:
    an integrated circuit including:
      a semiconductor substrate;
      a memory cell including one or more transistors disposed at least in part in or on a first side of the semiconductor substrate, wherein a second side of the semiconductor substrate is opposite the first side;
      a first interconnect coupled to a first of the one or more transistors, the first interconnect comprising a first conductive via extending through the semiconductor substrate, and the first interconnect comprising a first trace portion beneath the second side of the semiconductor substrate; and
      a second interconnect coupled to a second of the one or more transistors, the second interconnect comprising a second conductive via extending through the semiconductor substrate, and the second interconnect comprising a second trace portion beneath the second side of the semiconductor substrate; and
    a display device coupled to the integrated circuit, the display device to display an image based on exchanges each between the memory cell and a respective one of the first interconnect and the second interconnect.

12. The system of claim 11, wherein one of the first interconnect and the second interconnect is coupled to provide a control signal to the one or more transistors.

13. The system of claim 12, wherein the control signal includes one of a wordline signal and a bitline signal.

14. The system of claim 11, the integrated circuit further comprising a third interconnect coupled to a wordline above the first side of the semiconductor substrate.

15. The system of claim 11, a third interconnect coupled directly to a gate at the first side.

16. The system of claim 11, wherein the integrated circuit includes a first metal stack coupled to the semiconductor substrate via the second side.

* * * * *